United States Patent
Lim et al.

(10) Patent No.: US 8,954,322 B2
(45) Date of Patent: Feb. 10, 2015

(54) ACOUSTIC SHOCK PROTECTION DEVICE AND METHOD THEREOF

(75) Inventors: Meoung-Jin Lim, San Diego, CA (US); Sanghyun Chi, San Diego, CA (US)

(73) Assignee: VIA Telecom Co., Ltd., Grand Cayman (KY)

( * ) Notice: Subject to any disclaimer, the term of this patent is extended or adjusted under 35 U.S.C. 154(b) by 298 days.

(21) Appl. No.: 13/557,230

(22) Filed: Jul. 25, 2012

(65) Prior Publication Data
US 2013/0030799 A1    Jan. 31, 2013

Related U.S. Application Data

(60) Provisional application No. 61/511,499, filed on Jul. 25, 2011.

(51) Int. Cl.
*G10L 19/00*    (2013.01)

(52) U.S. Cl.
USPC .............................. 704/219; 704/225; 704/224

(58) Field of Classification Search
USPC ......... 704/206, 208, 233, 228, 210, 214, 215, 704/225, 219, 226
See application file for complete search history.

(56) References Cited

U.S. PATENT DOCUMENTS

| | | | | |
|---|---|---|---|---|
| 5,749,067 | A * | 5/1998 | Barrett | 704/233 |
| 6,377,915 | B1 * | 4/2002 | Sasaki | 704/206 |
| 8,538,749 | B2 * | 9/2013 | Visser et al. | 704/228 |
| 2011/0045874 | A1 | 2/2011 | Ku et al. | |
| 2011/0076947 | A1 | 3/2011 | Malachowsky | |

FOREIGN PATENT DOCUMENTS

| | | |
|---|---|---|
| CN | 1516378 | 7/2004 |
| WO | 2010044439 | 4/2010 |

\* cited by examiner

*Primary Examiner* — Huyen X. Vo
(74) *Attorney, Agent, or Firm* — Jianq Chyun IP Office

(57) ABSTRACT

An acoustic shock protection device includes a prediction gain estimator and an audio compressor. The prediction gain estimator is configured to analyze a plurality of linear prediction coefficients of an audio signal and determine a category of the audio signal. The audio compressor is coupled to the prediction gain estimator, and the audio compressor is configured to adjust a signal level of the audio signal according to the category of the audio signal.

15 Claims, 5 Drawing Sheets

ACOUSTIC SHOCK PROTECTION DEVICE AND METHOD THEREOF

CROSS-REFERENCE TO RELATED APPLICATION

This application claims the priority benefits of U.S. provisional application Ser. No. 61/511,499, filed on Jul. 25, 2011. The entirety of the above-mentioned patent application is hereby incorporated by reference herein and made a part of this specification.

BACKGROUND

1. Technical Field

The invention relates to an acoustic shock protection device, and more particularly to acoustic shock protection device with a plurality of threshold gain values for a compressor and a method thereof.

2. Related Art

Abrupt, unexpected, and high-level sound can cause acoustic shock, a physiological and psychoacoustic injury to telephone headset/handset users. Since this type of injury is not related to a malfunctioning equipment, acoustic shock protection (ASP) must be handled in the end of the signal processing block where the final output signal is prepared to play back. Acoustic shock protection is designed to protect telephone headset/handset users from the source of acoustic shock.

An audio compressor may be used to adjust the signal level of an audio signal and to prevent abnormal loudness in a receiver path of a communication device. It is desirable to maintain audio signal levels within a prescribed range to avoid signal distortion and to enhance the audibility. The audio compressor can function as a noise suppressor for low amplitude signals and as a compressor for high amplitude signals.

However, commercially available audio compressors may not be designed to protect the user from acoustic shock signals in a receiver of the communication device. As a result, these audio compressors cannot pass the objective acoustic shock protection test requirements defined by the 3rd Generation Partnership Project 2 (3GPP2) standardization group, for example. Moreover, these audio compressors are not able to sufficiently suppress some particular tone signals generated by corrupted Code Excited Linear Prediction (CELP) vocoder packets or other corrupted packets.

Therefore, there is a need of a new acoustic shock protection device in the art, that could sufficiently suppress the particular tone signals generated by corrupted packets; protect the user from long time loud sound of any kind; prevent the acoustic shock in the receiver and achieve the test requirements defined by 3GPP2.

SUMMARY

Several exemplary embodiments accompanied with figures are described in detail below to further describe the invention in details.

The invention provides an acoustic shock protection device, comprising: a prediction gain estimator configured to analyze a plurality of linear prediction coefficients of an audio signal and determine a category of the audio signal; and an audio compressor coupled to the prediction gain estimator, the audio compresspor configured to adjust a signal level of the audio signal according to the category of the audio signal.

The invention also provides an acoustic shock protection method, comprising: analyzing a plurality of linear prediction coefficients of an audio signal; determining a category of the audio signal; and adjust a signal level of the audio signal according to the category of the audio signal.

The invention further provides a communication device, comprising: a transceiver configured to receive a wireless signal; an audio processing unit coupled to the transceiver, the audio processing unit configured to decode an audio signal from the wireless signal; an acoustic shock prevention unit coupled to the audio processing unit the acoustic shock prevention unit configured to process the audio signal and output a shock prevented audio signal; and a signal converting and amplifying unit coupled to the acoustic shock prevention unit, the signal converting and amplifying unit configured to convert and amplify the shock prevented audio signal from the acoustic shock prevention unit. Wherein the acoustic shock prevention unit further comprising: a prediction gain estimator configured to analyze a plurality of linear prediction coefficients of the audio signal and determine a category of the audio signal; and an audio compressor coupled to the prediction gain estimator, the audio compressor configured to adjust a signal level of the audio signal according to the category of the audio signal.

In summary, by monitoring prediction gains with the acoustic shock protection unit, the communication device with acoustic shock protection and the method thereof according to embodiments of the invention can detect and suppress tone-like acoustic shock signals. Moreover, by monitoring 2 kHz tone signals, corrupted CELP codec packet related acoustic shock signals can be detected and suppressed. Furthermore, the gain controller in the acoustic shock protection unit is capable of constraining the dynamic range of the audio signal within the target dynamic range, thereby safeguarding the user from acoustic shock due to exposure of loud sound for a prolonged period.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
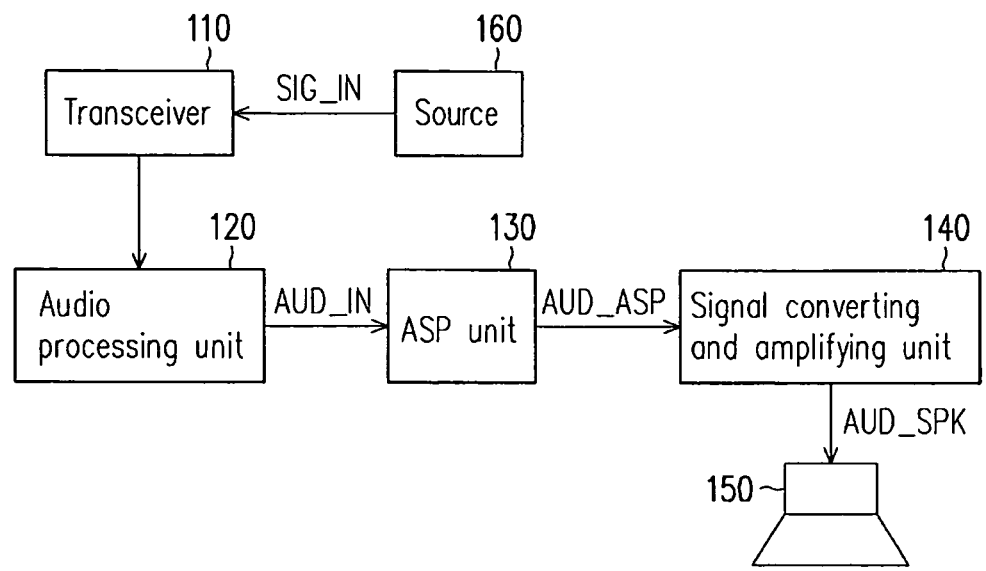
FIG. 1 is a schematic block diagram of a communication device according to an embodiment of the invention.

FIG. 1 is a schematic block diagram of a communication device with acoustic shock protection according to an embodiment of the invention. With reference to FIG. 1, a communication device 100 with acoustic shock protection includes a transceiver 110, an audio processing unit 120, an acoustic shock protection (ASP) unit 130, a signal converting and amplifying unit 140, and a speaker 150.

In the present embodiment, the transreceiver 110 is configured to receive a wireless signal SIG_IN from a source 160. The audio processing unit 120 is configured to decode an audio signal AUD_IN from the wireless signal SIG_IN. The ASP unit 130 is configured to process the audio signal AUD_IN and output a shock prevented audio signal AUD_ASP to the signal converting and amplifying unit 140. The signal converting and amplifying unit 140 is coupled between the ASP unit 130 and the speaker 150, and is configured to convert and amplify the shock prevented audio signal AUD_ASP from the ASP unit 130 and output a speaker signal AUD_SPK to the speaker 150.

It should be appreciated that the communication device 100 may include other components not illustrated in FIG. 1. For example, in some embodiments of the invention, the communication device 100 may further include a communication protocol module and a memory (not drawn). The transceiver 110 and the memory are both connected to the communication protocol module, for example. In some embodiments, the memory in the communication device 100 may be configured for temporarily storing parameters used for acoustic shock protection.

In various embodiments, the transceiver 110 may be configured to transmit and receive signals between the communication device 100 and the source 160 within the coverage range thereof, such as when the source 160 is a base station in a wireless broadcasting system, for example. However, the source 160 is not limited to being a base station. For instance, the source 160 may also be a storage medium in a computer (not drawn) providing an input wired or wireless signal to the communication device 100 from a wired network or a wired broadcasting system. Furthermore, the number of the source 160 is not limited to one, and in some embodiments, a plurality of wireless signals SIG_IN may be received from a plurality of corresponding sources 160. Furthermore, the communication device 100 may be part of a telephone, a mobile phone, a smart mobile phone, or a tablet computer, for example.

In one embodiment, the transceiver 110 may perform analog-to-digital signal conversion (ADC), digital-to-analog signal conversion (DAC), modulation, demodulation, signal amplification, low-pass filtering, and bandpass filtering on the received wireless signal SIG_IN. The transceiver 110 may also be configured to provide information of the wireless signal SIG_IN to the communication protocol module, modulate data received from the communication protocol module into a modulated signal, and transmit the modulated signal to other devices in the wireless broadcasting system.

There are three kind of sound that can cause acoustic shock: tone-like acoustic shock sound, corrupted packet caused acoustic shock sound and any kind of loud sound for a long time. The tone-like acoustic shock sound, such as a sudden high pitch tone sound, is caused by incorrectly dialed fax machines and shriek sound caused by screaming or blowing a whistle, for example; and the corrupted packet caused acoustic shock sound is caused by corrupted and CRC-passed CELP codec packets or other kinds of corrupted packets. Unlike techniques in the known art which do not distinguish these shock sounds and perform the same compression, the acoustic shock protection device of the disclosure has a compressor with a plurality of threshold gain values and may give each kind of shock sound a particular compression, so as to achieve a better acoustic shock protection. Moreover, the acoustic shock protection device of the invention can suppress the acoustic shock in the receiver, so the test requirements defined by 3GPP2 are achieved. The tone-like acoustic sound resembles to a pure sinusoidal waveform that has high prediction gain when converting reflection coefficients to linear spectral pair coefficients (hereinafter referred as linear prediction coefficients). Acoustic shocks caused by corrupted packets also resembles to some particular waveforms. The corrupted packets caused acoustic shock in the audio signal may be found by analyzing the linear prediction coefficients of the audio signal. If the linear prediction coefficients comprise the same coefficients as a particular waveform, there is a corrupted packets caused acoustic shock in the audio signal. In the embodiment, take the acoustic shock caused by corrupted and CRC-passed CELP codec packets as an example. But the invention is not intended to limit thereof, any kinds of acoustic shocks caused by other corrupted packets are in the scope of the invention. Reconstructed acoustic sound caused by a corrupted and CRC-passed CELP codec packets resembles a pure 2 kHz sinusoidal wave with high energy. Therefore, if the linear prediction coefficients of the audio signal include the same coefficients as a a pure 2 kHz sinusoidal wave, there is an acoustic sound caused by a corrupted and CRC-passed CELP codec packets in the audio signal. However, the invention is not limited thereto, and other acoustic sounds caused by other kinds of corrupted packets or the like that resemble other frequency waves are also in the scope of the invention. Corrupted CELP codec packet-related acoustic shock sound is detected and suppressed by monitoring 2 kHz tone signal. Acoustic shock sound is detected and suppressed by monitoring prediction gains. If those two categories of shock sounds are not detected, the audio signal is determined to be a normal voice signal. The invention may also prevent any prolonged loud sound under those three conditions.

Figure 2:
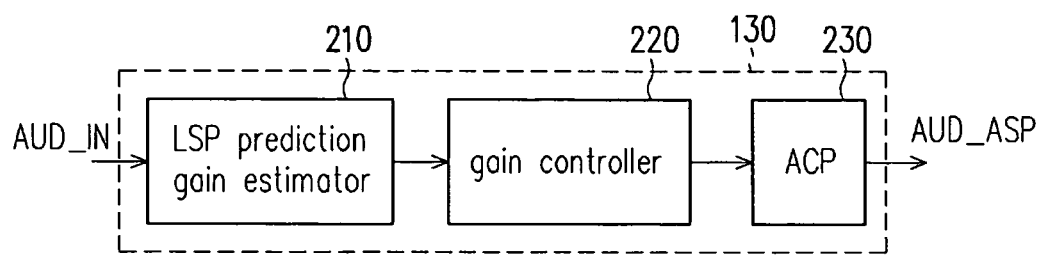
FIG. 2 is a schematic block diagram of an acoustic shock protection unit according to an embodiment of the invention.

FIG. 2 is a schematic block diagram of an acoustic shock protection unit according to an embodiment of the invention. With reference to FIG. 2, in the present embodiment, the ASP 130 includes a line spectral pair (LSP) prediction gain estimator 210, a gain controller 220, and an audio compressor (ACP) 230. The audio signal AUD_IN may have one of the three categories of shock sounds: 2 kHz tone signal, tone-like acoustic sound signal and normal voice signal. The LSP prediction gain estimator 210 is configured to analyze a plurality of linear prediction coefficients (LPC) of the audio signal AUD_In to find the 2 kHz tone signal, estimate a prediction gain of the audio signal AUD_IN based on the linear prediction coefficients to find the tone-like acoustic sound signal, and determine the audio signal AUD_In to be a normal voice signal if it couldn't find those two categories of shock sounds. Therefore, the LSP prediction gain estimator 210 determines which category of acoustic shock the audio signal AUD_IN is. The gain controller 220 is coupled between the LSP prediction gain estimator 210 and the ACP 230. Moreover, the gain controller 220 is configured to constrain a dynamic range of the audio signal AUD_IN within a target dynamic range, so as to prevent a sustained loud sound. Furthermore, the ACP 230 is configured to adjust a signal level of the audio signal AUD_IN according to a root-mean-square (RMS) power of the audio signal AUD_IN and the category of the audio signal AUD_IN determined by LSP prediction gain estimator 210; that is to give the particular category a corresponding compression.

In some embodiments of the invention, the LSP prediction gain estimator 210 performs an LSP Prediction Gain Estimation by performing the linear prediction coefficient (LPC) estimation on the audio signal AUD_IN, performing a prediction gain estimation as well and making a decision on which category the audio signal AUD_IN is. The ACP 230 adjusts the signal level of the audio signal AUD_IN by calculating the RMS power of the audio signal AUD_IN, detecting whether the audio signal is a 2 kHz tone or has a high prediction gain according to the decision made by LSP prediction gain estimator 210, adjusting a threshold gain value according to whether the audio signal AUD_IN is the 2 kHz tone and whether the audio signal AUD_IN has the high prediction gain, comparing the adjusted threshold gain value and the RMS power of the audio signal AUD_IN to determine whether to suppress the audio signal, and enabling suppression of the audio signal when the RMS power of the audio signal is greater than the threshold value. However, in other embodiments of the invention, the signal level of the audio signal AUD_IN may be adjusted using modified steps disclosed above, such as by changing the sequence of the steps, for example. In addition, detailed description of the principles behind the LPC prediction gain estimation by the LSP prediction gain estimator 210, the volume control by the gain controller 220, and the audio signal suppression by the ACP 230 are provided later in the specification.

According to some embodiments of the invention, when the audio signal AUD_IN has the 2 kHz tone, the ACP 230 adjusts the threshold value to a first value; when the audio signal AUD_IN has the high prediction gain (e.g., the audio signal AUD_IN is a periodic and predictive tone-like signal), the audio compressor increases the threshold value to a second value; and when the audio signal AUD_IN isn't those two categories but a normal voice signal, the audio compressor increases the threshold value to a third value. However, the invention is not limited thereto, and the threshold may be adjusted to be higher or lower as required by an actual condition. On the other hand, in another embodiment, whether the tone of the audio signal is 2 kHz is detected according to an inner product of the reflection coefficients of the audio signal AUD_IN.

In some embodiments, the gain controller 220 maintains a volume level of the audio signal AUD_IN when the dynamic range of the audio signal AUD_IN is within a target dynamic range, and the gain controller 220 adjusts the dynamic range of the audio signal AUD_IN when the dynamic range of the audio signal AUD_IN exceeds the target dynamic range, so as to prevent a prolonged loud sound. In some embodiments, the gain controller 220 is a smart gain controller that could maintain the volume level of each audio signal according the category thereof. In one embodiment, the LSP prediction gain estimator 210 estimates the prediction gain before the ACP 230 adjusts the signal level of the audio signal, although the invention is not limited thereto.

Furthermore, in some embodiments of the invention, the signal converting and amplifying unit 140 may include a digital-to-analog converter (DAC) and a power amplifier (not drawn). The DAC is configured to convert the shock prevented audio signal AUD_ASP into an analog signal, and the power amplifier is configured to amplify the analog shock prevented audio signal AUD_ASP and output the speaker signal AUD_SPK to the speaker 150.

Figure 3:
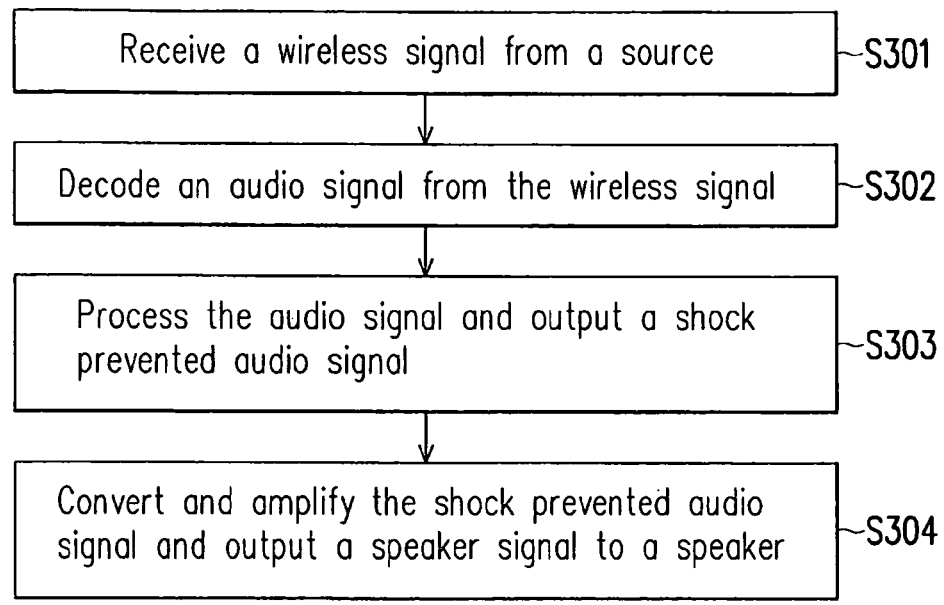
FIG. 3 is a flow diagram of a method for acoustic shock protection in a communication device according to an embodiment of the invention.

FIG. 3 is a flow diagram of a method for acoustic shock protection in a communication device according to an embodiment of the invention. The method for acoustic shock protection may be adapted for the communication device 100 depicted in FIG. 1 and described earlier. With reference to FIG. 3, in one embodiment of the invention, the method for acoustic shock protection includes the following steps. In Step S301, a wireless signal is received from a source. In Step S302, an audio signal is decoded from the wireless signal. In Step-S303, the audio signal is processed and a shock prevented audio signal is outputted. In Step S304, the shock prevented audio signal is converted and amplified and a speaker signal is outputted to a speaker.

Figure 4:
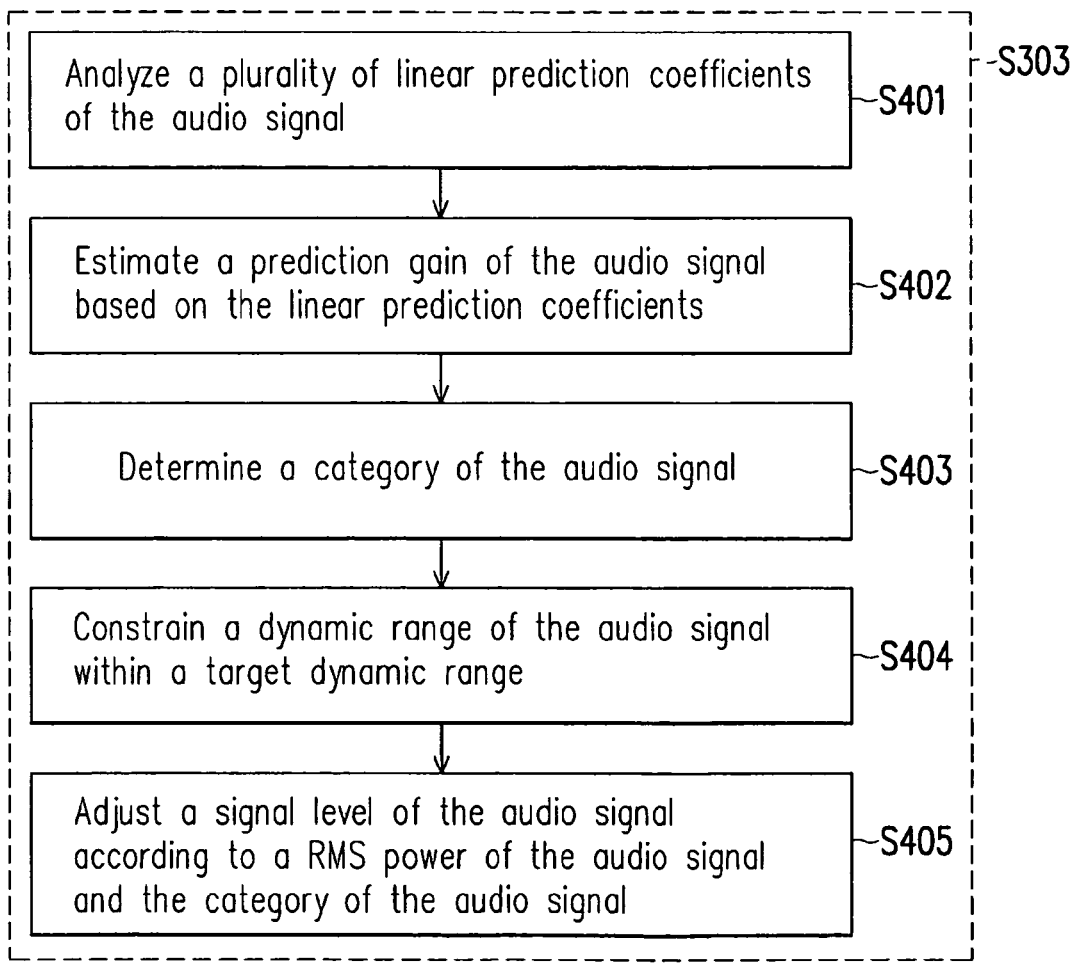
FIG. 4 is a flow diagram of audio signal processing in a method for acoustic shock protection according to an embodiment of the invention.

The audio signal processing of Step S303 in FIG. 3 is further depicted in FIG. 4, which is a flow diagram of audio signal processing in a method for acoustic shock protection according to an embodiment of the invention. With reference to FIG. 4, in Step 401, a plurality of linear prediction coefficients of the audio signal is analyzed. In Step 402, a prediction gain of the audio signal is estimated based on the linear prediction coefficients. In Step S403, a category of the audio signal is determined. In Step S404, a dynamic range of the audio signal is constrained within a target dynamic range. In Step S405, a signal level of the audio signal is adjusted according to a RMS power and the category of the audio signal.

Figure 5:
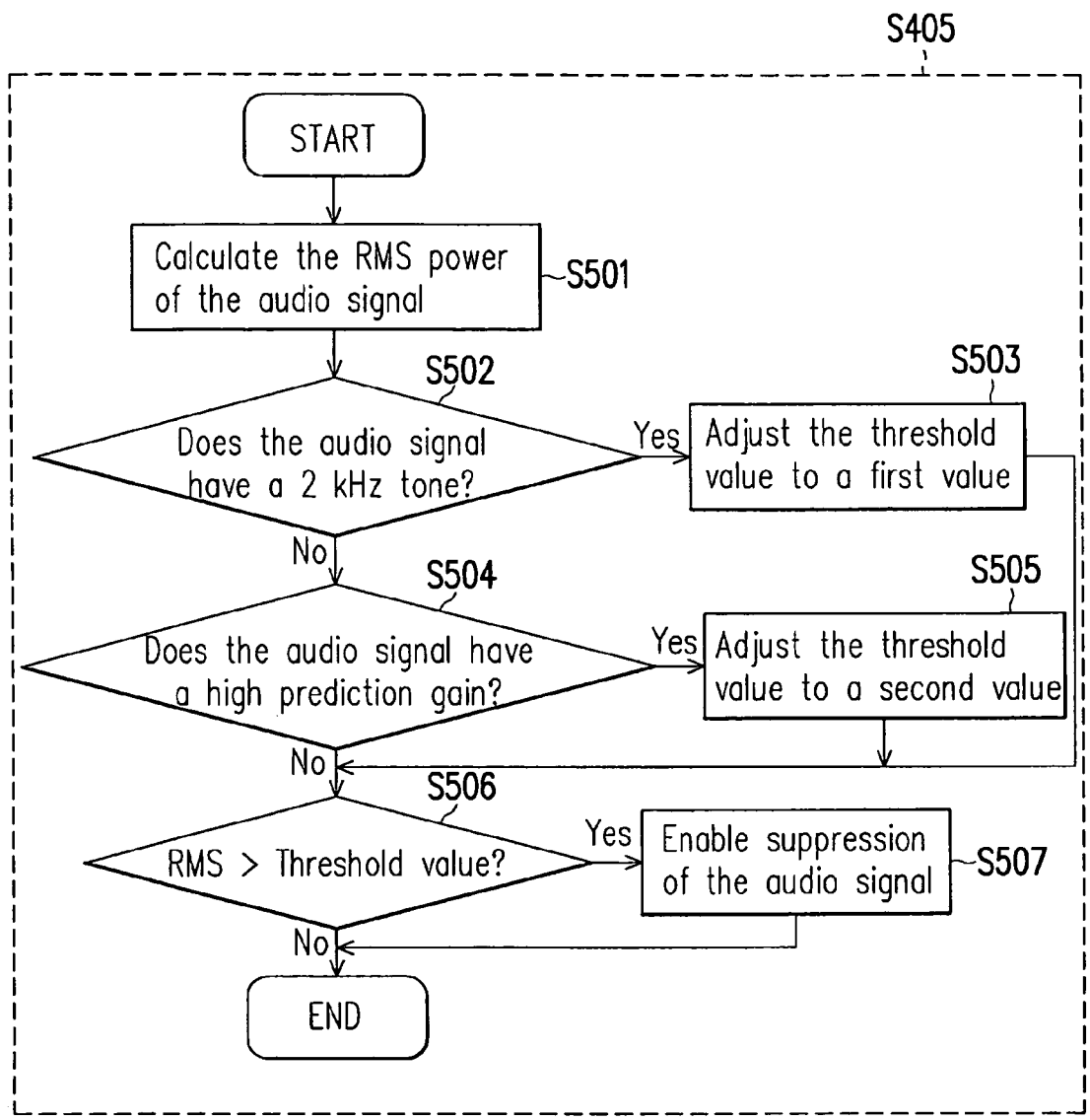
FIG. 5 is a flow diagram of signal level adjustment of an audio signal in a method for acoustic shock protection according to an embodiment of the invention.

The signal level adjustment of Step S405 in FIG. 4 is further depicted in FIG. 5, which is a flow diagram of signal level adjustment of an audio signal in a method for acoustic shock protection according to an embodiment of the invention. In some embodiments the process in. FIG. 5 is preforming by ACP 230, although the invention doesn't limited thereof. With reference to FIG. 5, in Step S501, the RMS power of the audio signal is calculated. In Step S502, whether the audio signal has a 2 kHz tone is determined. If there is the 2 kHz tone, a threshold value is adjusted to a first value as in Step S503. If not, the process proceeds to Step S504, and whether the audio signal has a high prediction gain is determined. If the audio signal has the high prediction gain, the threshold value is adjusted to a second value as in Step S505. The threshold may be adjusted to be higher or lower as required by an actual condition. If the audio signal does not have the high prediction gain, the process proceeds to Step S506, and the adjusted threshold value and the RMS power of the audio signal are compared in order to determine whether to suppress the audio signal. When the RMS power of the audio signal is greater than the threshold value, suppression of the audio signal is enabled as in Step S507.

In some embodiments, in FIG. 5 Step S502 of detecting the 2 kHz tone includes detecting whether the tone of the audio signal is a 2 kHz tone according to an inner product of the reflection coefficients of the audio signal. In other embodiments, in FIG. 4 Step 404 of constraining the dynamic range of the audio signal within the target dynamic range includes maintaining a volume level of the audio signal when the dynamic range of the audio signal is within the target dynamic range, and adjusting the dynamic range of the audio signal when the dynamic range of the audio signal exceeds the target dynamic range. In another embodiment, in FIG. 4 Step S402 of estimating the prediction gain of the audio signal is performed before Step 405 of adjusting the signal level of the audio signal, although the sequence of the steps is not limited thereto and may be changed as needed by an application. In other embodiments, in FIG. 3 Step 304 of converting and amplifying the shock prevented audio signal includes converting the shock prevented audio signal into an analog signal, and amplifying the analog shock prevented audio signal and outputting the speaker signal to a speaker.

In the disclosure below, detailed description of the principles behind the LPC prediction gain estimation by the LSP prediction gain estimator 210, the volume control by the gain controller 220, and the audio signal suppression by the ACP 230 are provided hereafter.

Figure 6:
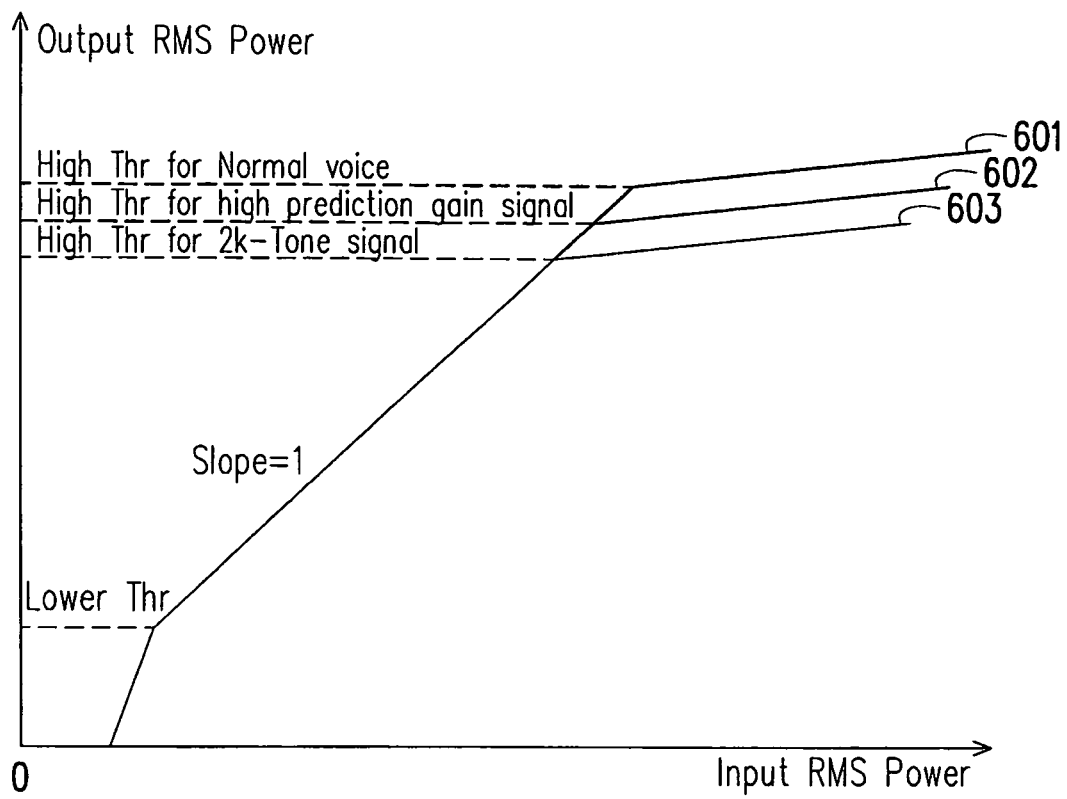
FIG. 6 is a relational diagram between input and output RMS powers of an audio signal being suppressed according to an embodiment of invention.

FIG. 6 is a relational diagram between input and output RMS powers of an audio signal being suppressed according to an embodiment of invention. Referring to FIG. 6, the suppression curves 601, 602, and 603 respectively represents a normal voice signal, a high prediction gain signal, and a 2 kHz tone signal being suppressed by a acoustic shock protection device and the method thereof according to an embodiment of the invention. The communication device and the method for acoustic shock protection may be the device and method described earlier in the disclosure. In FIG. 6, the slopes of the suppression curves 601-603 correspond to the gains to the input RMS powers of the respective audio signals. As shown in FIG. 6, when the output RMS power of the audio signal exceeds the high threshold value, the suppression curves 601-603 obtain the slow slope gain of 1/20, for example. On the other hand, when the signal power is below the lower threshold value, the suppression curves obtain the fast slope gain of 2. Since it is not the key point of the invention, the condition of fast slope gain is omitted.

Figure 7:
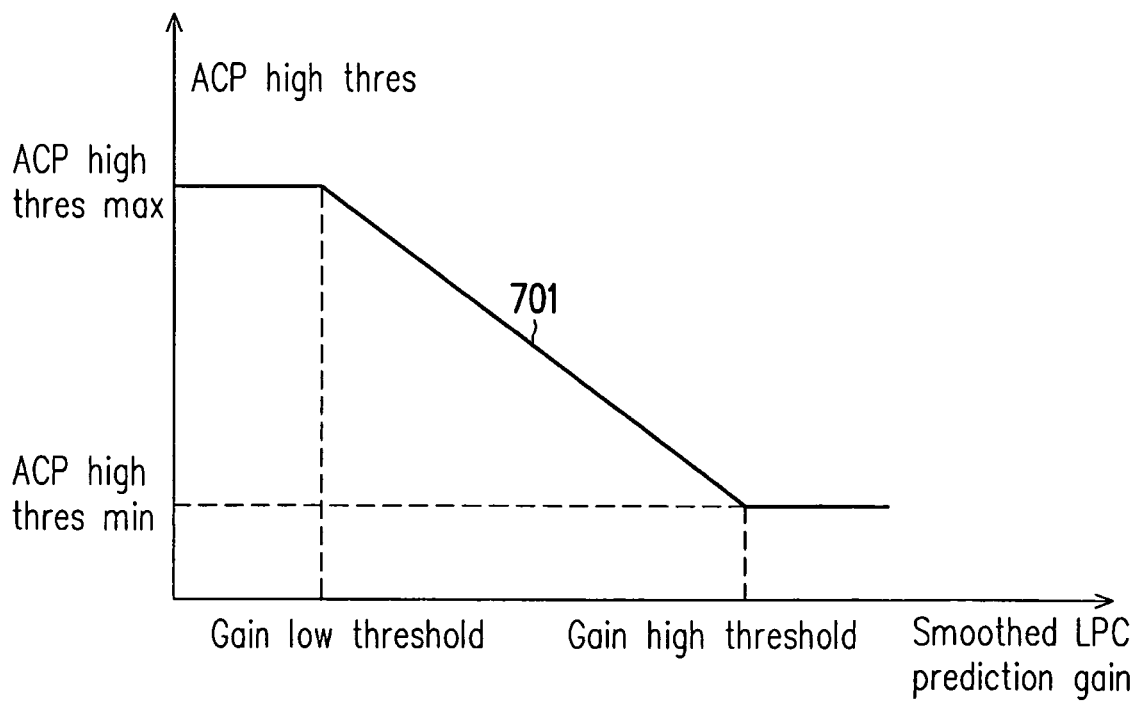
FIG. 7 is a relational diagram between a threshold value adjusted by an audio compressor and a smoothed LPC prediction gain according to an embodiment of the invention.

A tone-like audio signal resembles a pure sinusoidal waveform that has a high prediction gain when converting reflection coefficients to linear spectral pair coefficients. FIG. 7 is a relational diagram between a threshold value adjusted by an audio compressor and a smoothed LPC prediction gain according to an embodiment of the invention. With reference to FIG. 7, a curve 701 depicts the threshold value adjustment by the ACP according to the LPC prediction gain of the audio signal. The threshold value may be compared with the RMS power of an audio signal being compressed by a acoustic shock protection device and the method thereof according to an embodiment of the invention. The acoustic shock protection device and the method thereof may be the device and method described earlier in the disclosure. In some embodiments of the invention, the LPC prediction gain may be estimated from an input signal of the ACP, which may be a pulse-code modulated (PCM) signal. A high LPC prediction gain indicates the input signal is periodic and a predictive tone-like signal. When the LPC prediction gain is high, an ACP high threshold (e.g., threshold value of Steps S505 and S506 of FIG. 5) is reduced. As shown in FIG. 7, the high threshold value will be decreased as the prediction gain increases and becomes greater than a prediction gain low threshold to further suppress the input signal and thereby protect the user's ear from the tone-like high power signal.

Figure 8:
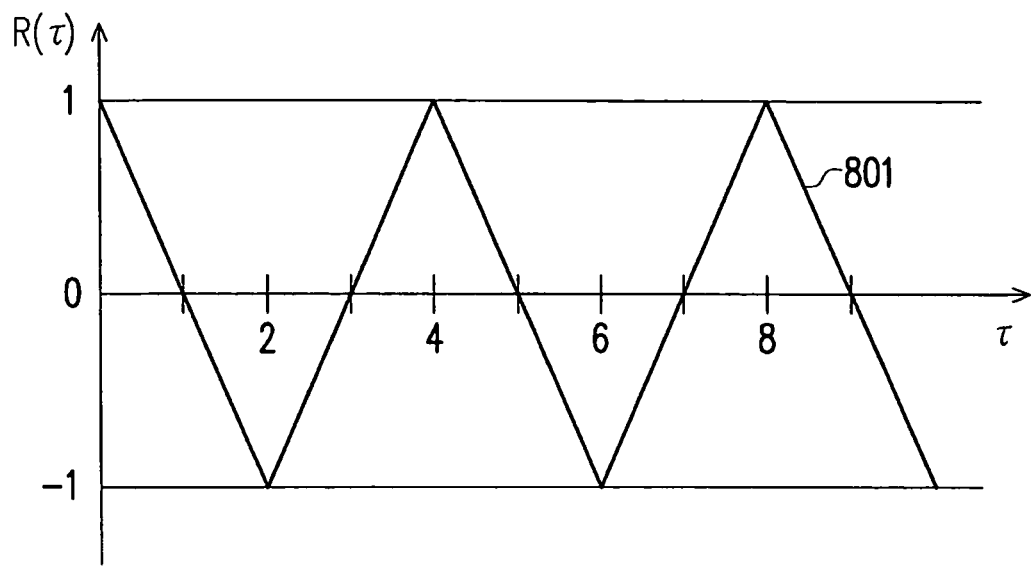
FIG. 8 is a curve diagram illustrating normalized reflection coefficients of a 2 kHz sinusoidal signal.

FIG. 8 is a curve diagram illustrating normalized reflection coefficients of a 2 kHz sinusoidal signal. Referring to FIG. 8, a curve 801 depicts the characteristics of the normalized reflection coefficients of a 2 kHz signal generated by a CELP codec with a corrupted packet. Acoustic shock signals generated by CELP codec with a corrupted packet may be characterized by a 2 kHz pitch tone signal. In general, the pitch of normal human voice cannot approach 2 kHz because of the physiological limitations of the human speech production system. Therefore, suppression of a 2 kHz pure tone is desired to prevent acoustic shock when the CELP codec operates. In some embodiments of the invention, normalized reflection coefficients are used in detection of the 2 kHz tone signal. To detect the 2 kHz tone signal, the inner product of partial normalized reflection coefficients are used. With reference to FIG. 8 as an illustrative example, one partial vector is defined as $P_1=R(2,3,4,5)$, while the other is $P_2=R(6,7,8,9)$. The inner product of partial vector, $\chi$, is given by equation (1), $$\chi = \sum_{i=0}^{3} P_1(i) \times P_2(i) \tag{1}$$

In some embodiments, whether an audio signal is a 2 kHz tone signal is then determined by the decision rule given by (2), $$\begin{cases} S_0: 2k-\text{tone}, & \text{if } \chi > \eta \\ S_1: \text{non-}2k-\text{tone}, & \text{if } \chi \leq \eta \end{cases} \tag{2}$$

where $\eta$ represents a decision boundary.

Figure 9:
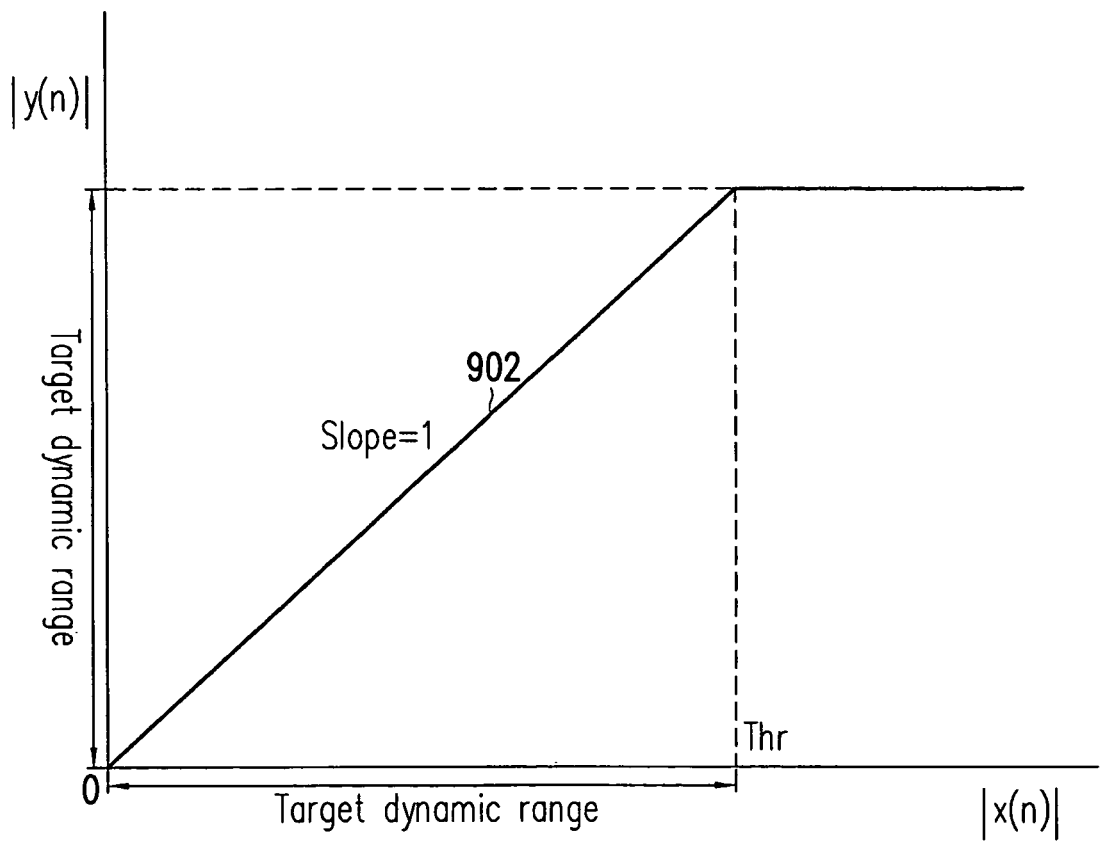
FIG. 9 is a relational diagram between the dynamic range of an input signal and the dynamic range of an output signal of a gain controller according to an embodiment of the invention.

FIG. 9 is a relational diagram between the dynamic range of an input signal and the dynamic range of an output signal of a gain controller according to an embodiment of the invention. To protect users from the case of abrupt, loud, non-tone-like signal cases, a gain controller described earlier in the disclosure may be employed in a communication device with acoustic shock protection or a method thereof. The gain controller is capable of adjusting the dynamic range of the output signal while maintaining the volume level as long as the input signal does not exceed a a target dynamic range below a boundary Thr, as shown by a curve 902 in an illustrative example depicted in FIG. 9.

In view of the foregoing, by monitoring prediction gains with the acoustic shock protection device, the acoustic shock protection device and the method thereof according to embodiments of the invention can detect and suppress tone-like acoustic shock signals. Moreover, by monitoring 2 kHz tone signals, corrupted CELP codec packet related acoustic shock signals can be detected and suppressed. Furthermore, the gain controller in the acoustic shock protection unit is capable of constraining the dynamic range of the audio signal within the target dynamic range, thereby safeguarding the user from acoustic shock due to exposure of loud sound for a prolonged period. Since the acoustic shock protection device of the invention can prevent the acoustic shock in the receiver, the test requirements set forth by 3GPP2 are achieved.

Therefore, the acoustic shock protection device of the invention could sufficiently suppress the particular tone signals generated by corrupted packets, protect the user from prolonged loud sound of any kind, and prevent the acoustic shock in the receiver and achieve the test requirements defined by 3GPP2.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An acoustic shock protection device, comprising:
   a prediction gain estimator configured to analyze a plurality of linear prediction coefficients of an audio signal and determine a category of the audio signal; and
   an audio compressor coupled to the prediction gain estimator, the audio compressor configured to adjust a signal level of the audio signal according to the category of the audio signal, wherein the audio compressor is further configured to adjust a threshold gain value to a first value when the category of the audio signal is a particular waveform signal, adjust the threshold gain value to a second value when the category of the audio signal is a tone-like acoustic sound signal, and adjust the threshold gain value to a third value when the category of the audio signal is not the particular waveform signal or the tone-like acoustic sound signal.

2. The acoustic shock protection device according to claim 1, wherein the prediction gain estimator further configured to determine whether the category of the audio signal is a particular waveform signal according to the plurality of linear prediction coefficients of the audio signal.

3. The acoustic shock protection device according to claim 2, wherein the particular waveform signal is a 2 kHz tone signal caused by a plurality of corrupted packets.

4. The acoustic shock protection device according to claim 1, wherein the prediction gain estimator further configured to estimate a prediction gain of the audio signal based on the plurality of linear prediction coefficients to determine whether the category of the audio signal is a tone-like acoustic sound signal.

5. The acoustic shock protection device according to claim 4, wherein if the prediction gain is higher than a first threshold, the category of the audio signal is the tone-like acoustic sound signal.

6. The acoustic shock protection device according to claim 4, wherein when the prediction gain is higher than a first threshold and lower than a second threshold, a threshold gain value of the audio compressor is decreased as the prediction gain increases.

7. The acoustic shock protection device according to claim 1, wherein the audio compressor further configured to:
compare the threshold gain value and a root-mean-square power of the audio signal;
when the root-mean-square power of the audio signal is larger than the threshold gain value, suppress signal level of the audio signal.

8. The acoustic shock protection device according to claim 1, further comprising:
a gain controller coupled between the prediction gain estimator and the audio compressor, the gain controller configured to constrain a dynamic range of the audio signal within a target dynamic range.

9. An acoustic shock protection method, comprising:
analyzing, by using a prediction gain estimator, a plurality of linear prediction coefficients of an audio signal;
determining, by the prediction gain estimator, a category of the audio signal;
adjusting, by using an audio compressor, a signal level of the audio signal according to the category of the audio signal;
adjusting, by using the audio compressor, a threshold gain value to a first value if the category of the audio signal is a particular waveform signal;
adjusting, by using the audio compressor, the threshold gain value to a second value if the category of the audio signal is a tone-like acoustic sound signal; and
adjusting, by using the audio compressor, the threshold gain value to a third value if the category of the audio signal is not the particular waveform signal or the tone-like acoustic sound signal.

10. The acoustic shock protection method according to claim 9, wherein determining a category of the audio signal further comprises:
determining whether the category of the audio signal is a particular waveform signal; and
estimating a prediction gain of the audio signal based on the plurality of linear prediction coefficients to determine whether the category of the audio signal is a tone-like acoustic sound signal, wherein if the prediction gain is higher than a first threshold, the category of the audio signal is a tone-like acoustic sound signal.

11. The acoustic shock protection method according to claim 10, wherein the particular waveform signal comprises a 2 kHz tone signal caused by a plurality of corrupted packets.

12. The acoustic shock protection method according to claim 10, wherein when the prediction gain is higher than a first threshold and lower than a second threshold, a threshold gain value of the audio compressor is decreased as the prediction gain increases.

13. The acoustic shock protection method according to claim 9, further comprising:
comparing the threshold gain value and a root-mean-square power of the audio signal; and
when the root-mean-square power of the audio signal is larger than the threshold gain value, suppressing the signal level of the audio signal.

14. The acoustic shock protection method according to claim 9, further comprising:
constraining a dynamic range of the audio signal within a target dynamic range.

15. A communication device, comprising:
a transceiver configured to receive a wireless signal;
an audio processing unit coupled to the transceiver, the audio processing unit configured to decode an audio signal from the wireless signal;
an acoustic shock prevention unit coupled to the audio processing unit, the acoustic shock prevention unit configured to process the audio signal and output a shock prevented audio signal; and
a signal converting and amplifying unit coupled to the acoustic shock prevention unit, the signal converting and amplifying unit configured to convert and amplify the shock prevented audio signal from the acoustic shock prevention unit,
wherein, the acoustic shock prevention unit further comprises:
a prediction gain estimator configured to analyze a plurality of linear prediction coefficients of the audio signal and determine a category of the audio signal; and
an audio compressor coupled to the prediction gain estimator, the audio compressor configured to adjust a signal level of the audio signal according to the category of the audio signal,
wherein the audio compressor is further configured to adjust a threshold gain value to a first value when the category of the audio signal is a particular waveform signal, adjust the threshold gain value to a second value when the category of the audio signal is a tone-like acoustic sound signal, and adjust the threshold gain value to a third value when the category of the audio signal is not the particular waveform signal or the tone-like acoustic sound signal.

* * * * *